United States Patent [19]
Lee

[11] Patent Number: 6,154,716
[45] Date of Patent: Nov. 28, 2000

[54] SYSTEM AND METHOD FOR SIMULATING ELECTRONIC CIRCUITS

[75] Inventor: David C. Lee, Allentown, Pa.

[73] Assignee: Lucent Technologies - Inc., Murray Hill, N.J.

[21] Appl. No.: 09/126,013

[22] Filed: Jul. 29, 1998

[51] Int. Cl.[7] .................................................. G06F 17/16
[52] U.S. Cl. .................................................. 703/2; 703/14
[58] Field of Search .................................. 703/14, 2, 13

[56] References Cited

U.S. PATENT DOCUMENTS

| | | | |
|---|---|---|---|
| 5,467,291 | 11/1995 | Fan et al. ........................... | 395/500.35 |
| 5,588,142 | 12/1996 | Sharrit ................................ | 395/500.35 |
| 5,604,911 | 2/1997 | Ushiro ................................ | 395/500.23 |
| 5,867,416 | 2/1999 | Feldmann et al. ...................... | 708/801 |

OTHER PUBLICATIONS

S. A. Maas, "Harmonic Balance and Large–Signal–Small–Signal Analysis", *Nonlinear Microwave Circuits*, Chapter 3, IEEE Press, pp. 81–112.

H. G. Brachtendorf et al., "A Simulation Tool for the Analysis and Verification of the Steady State of Circuit Designs", International Journal of Circuit Theory and Applications, vol. 23, (1995) pp. 311–323.

K. S. Kundert et al., "Steady–State Methods for Simulating Analog and Microwave Circuits", Kluwer Academic Publishers, pp. 82–156.

M. M. Gourary et al., "Iterative Solution of Linear Systems in Harmonic Balance Analysis", MTT–97.

David Long et al., "Full–chip Harmonic Balance", Lucent Technologies Bell Laboratories, CICC97.

Feldmann et al. "Efficient Frequency Domain Analysis of Large Nonlinear Analog Circuits," Proc. of IEEE CICC, May 1996, pp. 461–464.

Mayaram et al. "A Parallel Block–Diagonal Preconditioned Conjugate–Gradient Solution Algorithm for Circuit and Device Simulations," ICCAD, Nov. 1990, pp. 446–449.

Fischer et al. "Optimum Scaling of Non–Symmetric Jacobian Matrices for Threshold Pivoting Preconditioners," Int'l Workshop on Numberical Modeling of Processes and Devices for Integrated Circuits, Jun. 1994, pp. 123–126.

Rotstein, B. "Preconditioning of Transfer Matrices: Bounding the Frequency Dependent Structured Singular Value," IEEE Trans. on Automatic Control, vol. 39, No. 11, Nov. 1994, pp. 2287–2292.

Booth et al. "Combined Diagonal/Fourier Preconditioning Methods for Image Reconstruction in Emission Tomography," Int'l Conf. on Image Processing, vol. 2, Oct. 1995, pp. 441–444.

*Primary Examiner*—Kevin J. Teska
*Assistant Examiner*—Kyle J. Choi
*Attorney, Agent, or Firm*—Ratner & Prestia

[57] ABSTRACT

Improvements are made to an electronic circuit simulator. The circuit is represented by a set of nodes to which devices and components are connected. In a computer simulator of circuit behavior using the Harmonic Balancing methodology it is desirable to precondition the Jacobian matrix associated with the circuit equations. Proper preconditioning of the Jacobian matrix may increase the computational efficiency of the simulator. A preconditioning matrix for the Jacobian matrix may be obtained by generating an inverse matrix for dissimilar diagonal blocks.

2 Claims, 4 Drawing Sheets

SYSTEM AND METHOD FOR SIMULATING ELECTRONIC CIRCUITS

FIELD OF THE INVENTION

The present invention relates to a computer system and method for simulating electronic circuits.

BACKGROUND OF THE INVENTION

The complexity of modem integrated circuits and the high cost of fabricating prototypes has led to the development of a class of computer programs that simulate the operation of a circuit. Simulation tools for analog and microwave circuits that are accurate and reliable are required to meet design specifications. Simulators are often helpful for determining steady state properties of circuits such as bias voltages to be applied to the various components. Thus, by the use of a simulator it is possible to verify the proper operation of a circuit before resources are committed to the fabrication of prototypes.

The simulator is supplied with a description of the circuit. The description contains characteristics and parameters of circuit components and devices and their interconnections. A user may be supplied with a graphical or other type of interface in order to input the circuit description. A computer program can derive a list from the user supplied description containing the details of the circuit including a its nodes, various components and devices, and their interconnections. The user may define the behavior of components and devices or utilize a library of standard components provided with the simulation program. The state of each components or device is determined by the current the component or device sources or sinks and the voltage across it. In some cases the behavior of a component or device may also depend not just on its current state but on its state history as well. The state of the circuit may be given in terms of the value of the voltages at each of its nodes.

The simulation program finds the set of node voltages that conform to Kirchoff's laws. In other words, the simulation program finds the set of node voltages such that the sum of the currents at each node is zero. This set of node voltages represents a state of the circuit in which the currents provided by a set of sourcing components or devices are exactly matched by currents supplied to a complementary set of components or devices that are sinking current. Each component or device is modeled in the computer by a mathematical relation between the current sinked or sourced by the component or device in response to an input voltage. For example, if a component is a capacitor, then the current through it will depend on the corresponding node voltages and the rate of change of the node voltages with time. The rate of change of the voltage at a node may be computed from previous values of node voltages, i.e. the "history of the nodes".

The simplest type of simulation determines the steady state behavior of the circuit, i.e., its DC operating conditions. Such simulations may be useful in setting various bias voltages on key nodes in the circuit. Determining the steady state solution reduces to finding the solution of a system of nonlinear equations. Typically such nonlinear equations may be solved by an iterative procedure such as a Newton-Raphson iteration. The number of nonlinear equations is at least N, where N is the number of nodes in the circuit.

The simulation of the circuit under transient or large signal operating conditions is substantially more complex. The voltage is determined as a function of time at one or more nodes in the circuit when some input node is connected to a voltage source or current source that supplies an excitation signal. The requirement that the currents entering a node are balanced by the currents leaving the node leads to a mathematical model of the circuit behavior. The mathematical model is expressed in set of differential equations. A circuit having N nodes is now described by a set of at least N differential-algebraic equations.

Numerical methods for solving such systems of nonlinear differential-algebraic equations have been developed. Many such numerical methods require that an iterative process be executed at each time point. Hence, the solution of the transient simulation problem is much more computationally complex than the solution of the DC simulation.

The interval between time points is typically determined by the highest frequency expected at any node having a component connected to it whose output depends on the rate of change of the node voltage, i.e. the first derivative of the node voltage. The first derivative may be determined by fitting the current node voltage and one or more previous node voltages to a curve. The slope of the curve is then used as an approximation of the first derivative. If successive time points are far apart, an approximation could lead to significant errors in the calculation of the first derivative. These errors cause unknown errors in predicting the state of an inductor or capacitor in the circuit. Hence, simulations of transients typically have errors that increase with the time step size. Therefore, to achieve the required accuracy in a simulation the number of time steps per second may be chosen to be an order of magnitude higher than the highest frequency expected at the most sensitive node.

Consider a simulation in which the excitation or input signal to the circuit is a 10 kHz modulation of a 10 GHz microwave signal. In order to view the circuit response over 10 cycles of the modulation envelope, i.e. one millisecond, with a step size equal to one tenth the period of the carrier, the circuit behavior must be computed at 100 million time points. If the behavior at each of 1000 nodes is to be recovered, the memory space needed for storing the results alone becomes problematic.

If the input wave form (excitation signal) is periodic or almost periodic (i.e. the ratios of the frequencies of the sinusoids are irrational numbers), the computational difficulties can be substantially reduced through the use of Harmonic balancing techniques. In this case, the excitation signal may be expressed by a sum of sinusoids having fixed frequencies and amplitudes. Each circuit component or device sources or sinks current in response to each of the sinusoids at the nodes connected to the component or device. If the excitation signal is represented by 10 sinusoids, the components or devices provide 10 current signals corresponding to the 10 sinusoids plus currents at harmonics and intermodulation products associated with the 10 sinusoids. Each current is expressed by a complex number representing the current's amplitude and phase. The currents associated with harmonics need be considered because a nonlinear device may excite one or more harmonics of an input signal. The simulation problem can then be reduced to solving a set of nonlinear equations in which the currents entering and leaving every node at each frequency are balanced.

Harmonic Balancing techniques relieve the burden of having to compute solutions at each time point. The system of equations defining the simulation problem, however, is now n times larger, where n is the number of harmonics for which each device must provide current data. Hence, the Harmonic Balance technique is applied in S cases where the computing system is able to solve a system of equations of order nN, where N is the number of nodes.

Harmonic Balance is a well-established frequency-domain method for steady state analysis of circuits exhibiting periodic and quasi-periodic behavior. Harmonic Balance is often used to analyze distortion, nonlinear transfer characteristics, noise performance and stability in electronic circuits for amplifiers, mixers, and oscillators. In the Harmonic Balance methodology each variable in the circuit is represented using a Fourier series. In the frequency-domain the equivalent of differentiation with respect to time in the time-domain is multiplication by the Fourier frequency (more precisely, multiplication by $j\omega$). The application of Harmonic Balancing to the problem of simulating an electronic circuit results in a mathematical model expressed by a large system of nonlinear algebraic equations.

The unknowns in the system of nonlinear algebraic equations are the Fourier coefficients for each circuit variable. Typically, the system of nonlinear equations modeling the circuit are solved using, for example, a method such as Newton's method or the like. Many conventional software implementations of such numerical methods require storing and factoring of a relatively dense Jacobian matrix associated with the circuit equations. These costly operations limit the ability to apply Harmonic balancing methods to circuits containing only few nonlinear devices, e.g. transistors, and requiring the calculation of only a few Fourier coefficients. Recently, it has been demonstrated that iterative linear algebraic techniques may be used to solve problems involving large Jacobian matrices; thus extending the applicability of Harmonic Balancing methods to large circuits and systems.

SUMMARY OF THE INVENTION

An improvement to a method and system for simulating the response of a circuit to an excitation signal using a digital computer. The circuit is described by a plurality of nodes each connected to at least one device. The circuit behavior at each of the plurality of nodes is described by a set of circuit equations. A plurality of diagonal blocks of the Jacobian matrix, associated with the set of circuit equations, are calculated. Each diagonal block corresponds to one of a plurality of frequencies related to harmonics of the excitation signal. The plurality of diagonal blocks are partitioned into at least one set of matrices. Each set of matrices corresponds to ones of the plurality of frequencies that are substantially equal. A set of inverse matrices, each associated with one set of matrices, are generated. A preconditioning matrix for the Jacobian matrix is created from the set of inverse matrices.

DETAILED DESCRIPTION

The present invention is a system and a method which provides improvements to electronic circuit simulators. The computer technique brought forth by the present invention enables the construction of new circuit simulators that utilize the Harmonic Balancing methodology through the application of numerical algorithms that are tightly coupled with iterative linear algebraic techniques. The computer technique brought forth by the present invention significantly reduce the amount of computer memory and time required in the simulation of large circuits and systems exhibiting a periodic or quasi-periodic steady state.

Figure 1:
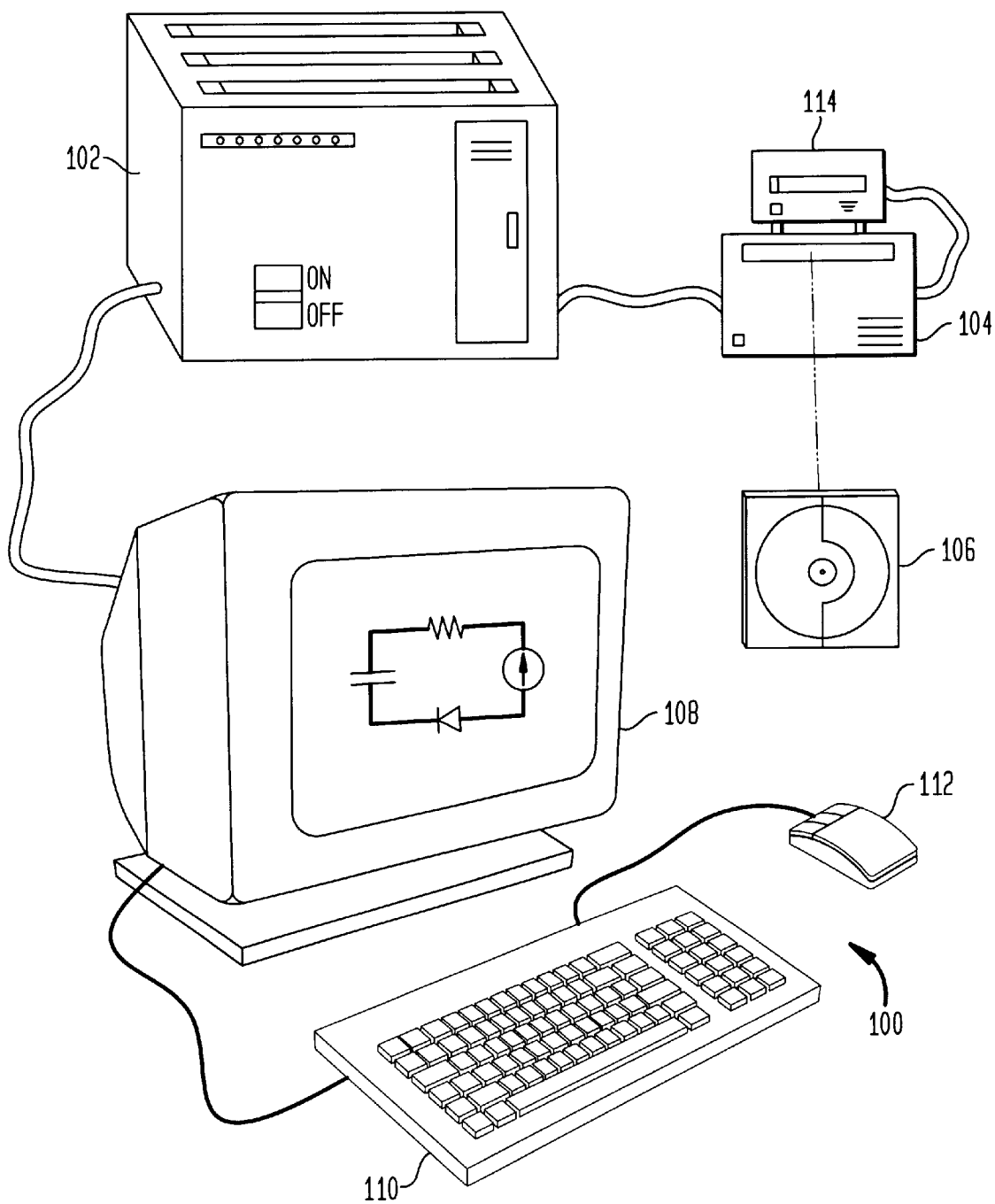
FIG. 1 is a schematic diagram of an exemplary circuit simulation computer system for use in accordance with the present invention.

FIG. 1 is a schematic diagram of an exemplary circuit simulation computer system for use in accordance with the present invention. A computer system 100 includes one or more computers. At least one computer 102 is provided. Computer 102 includes random access memory, or RAM (not shown), and storage devices, which may include a hard disk drive (not shown), a CD-ROM drive 104, and a ZIP drive, DAT drive 114, or floppy disk drive for reading a removable storage medium, such as optical disc 106. Computer 102 has a display 108, and input devices, such as a keyboard 110 and a pointing device. In the exemplary embodiment of FIG. 1, the pointing device is a mouse 112, but one of ordinary skill in the art recognizes that the pointing device may be a track ball, touch pad, or other equivalent device. Computer 102 has a software program for simulating electronic circuits.

Figure 2:
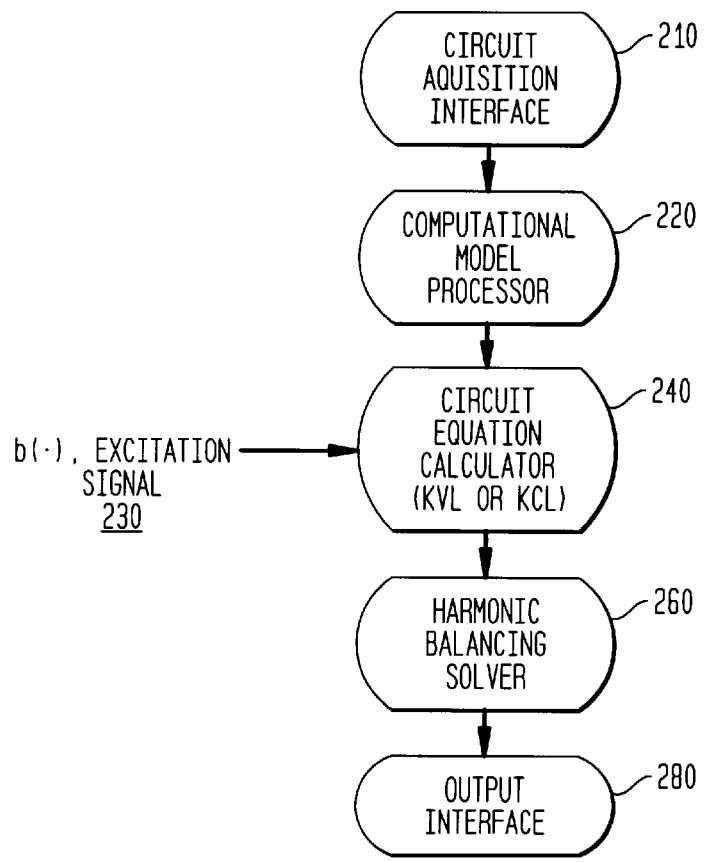
FIG. 2 is a block diagram of an electronic circuit simulation system in accordance with the present invention.

FIG. 2 shows the basic structure of an electronic circuit simulator that employs Harmonic Balancing in conjunction with an iterative gradient method such as Newton-Raphson. Harmonic Balance techniques for the analysis of circuits are discussed in Stephen A. Maas, *NONLINEAR MICROWAVE CIRCUITS*, IEEE PRESS, New York, 1997, incorporated by reference herein in its entirety.

The circuit interconnections and characteristics or parameters of the various nonlinear devices of the circuit are acquired via a circuit acquisition interface 210, for example MicroSim Schematics by MicroSim Corp. a Windows graphical user interface for entering schematics and preparing designs for simulation and PCB layout, or Design Architect by Mentor Graphics Corp. which can generate a netlist from a circuit schematic that a circuit simulator can read.

The acquired circuit description is then processed into a computational model for the various components, devices, and interconnections 220. The computational model for the circuit and a given excitation signal are formulated into a set of equations (resulting from the application of Kirchoffs laws), by a circuit equation calculator 240, representing the operation of the circuit forced by the excitation signal 230. An iterative calculation which may be, for example, Newton-Raphson or the like is applied to find the solution to the circuit equations by a harmonic balancing solver 260, and the result displayed on an output interface 280.

Figure 3:
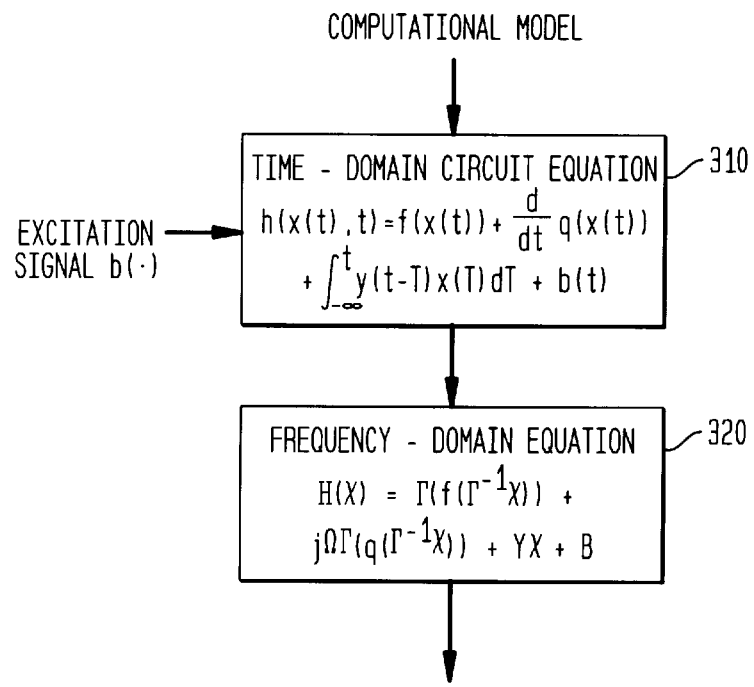
FIG. 3 is a block diagram of an exemplary calculation useful for obtaining a Harmonic Balancing system of equations in accordance with the present invention.
Figure 4:
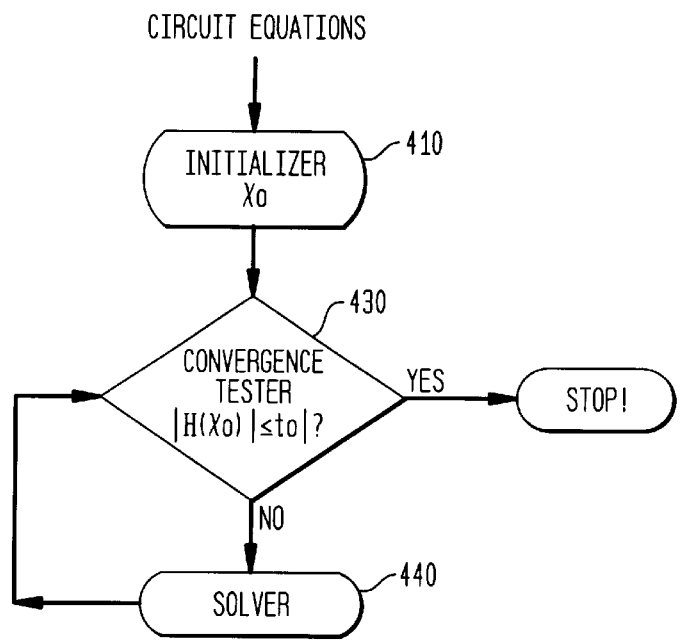
FIG. 4 is a block diagram showing an iterative process for the solution of Harmonic Balancing systems of equations.
Figure 5:
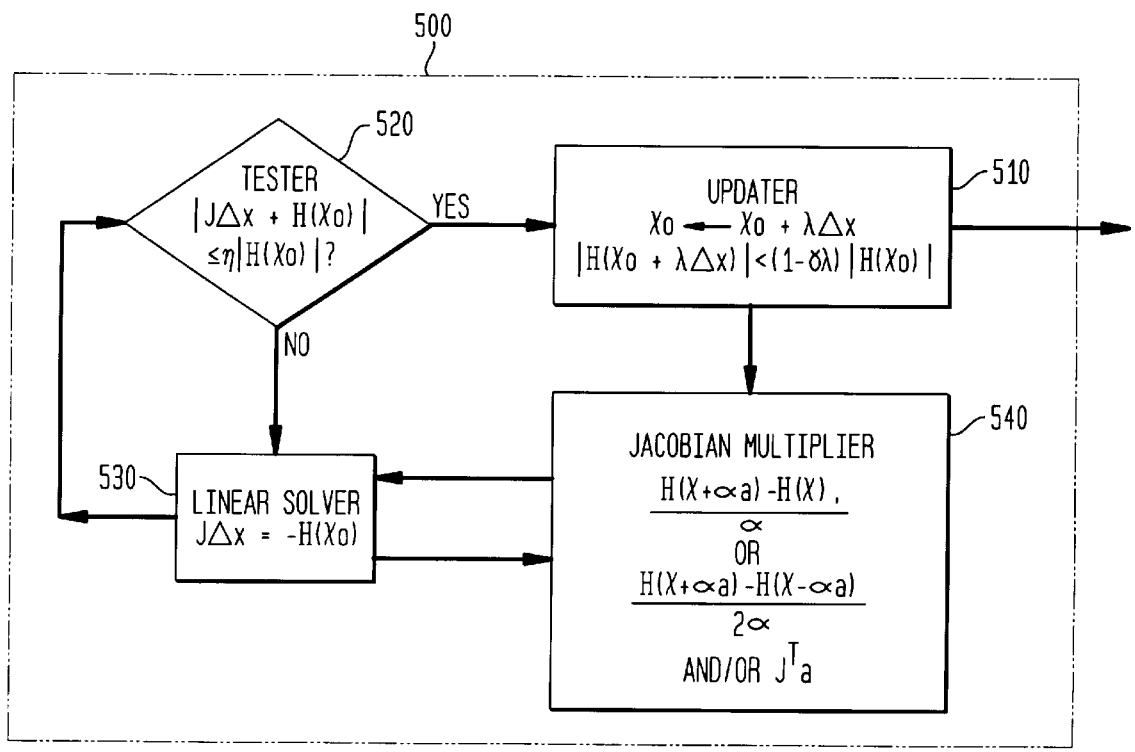
FIG. 5 is a block diagram showing a Newton-Raphson iteration for use in the solution of Harmonic Balancing systems of equations in accordance with an exemplary embodiment of the present invention.
Figure 6:
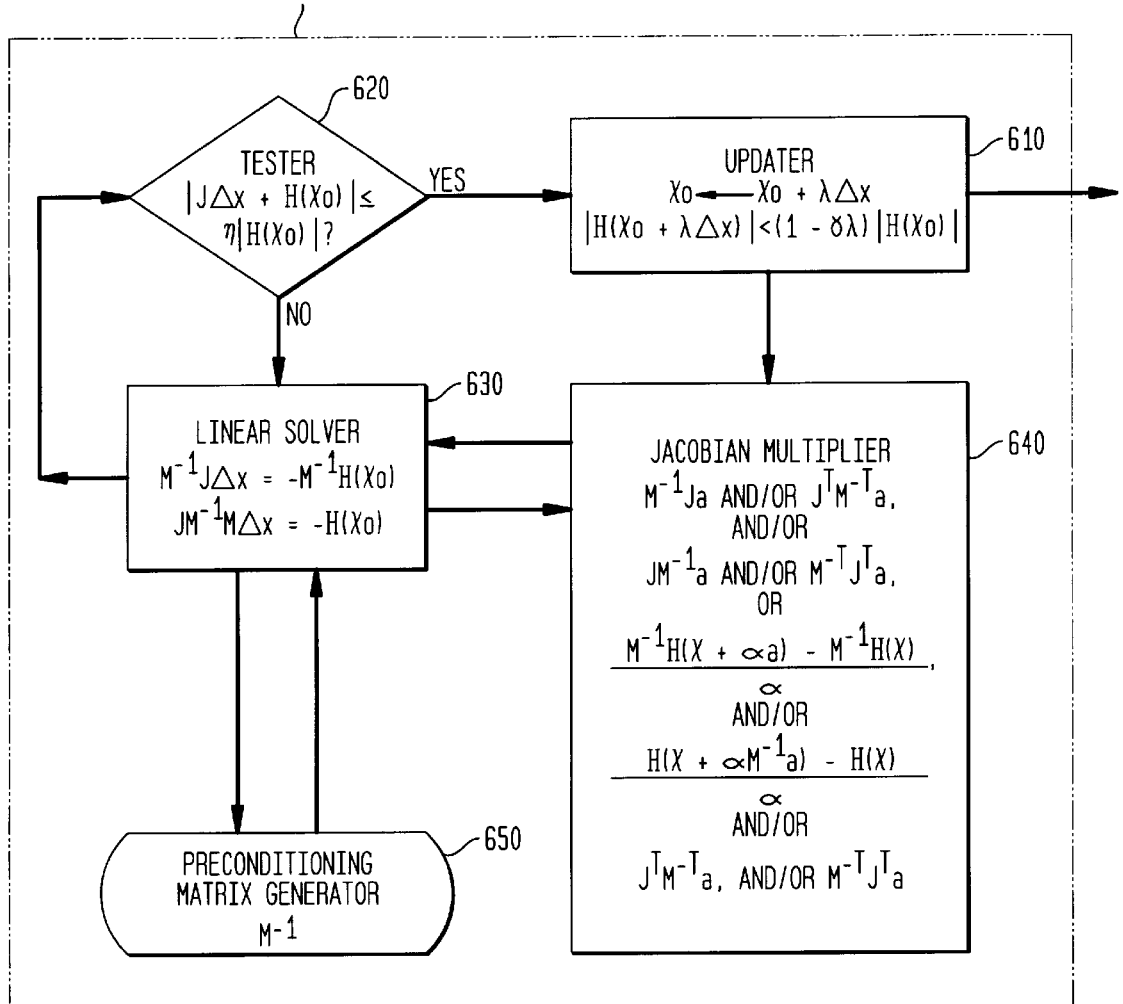
FIG. 6 is a block diagram showing a Newton-Raphson iteration using Jacobian preconditioning for use in the solution of Harmonic Balancing systems of equations in accordance with an exemplary embodiment of the invention.

FIG. 3 shows an exemplary calculation of circuit equations and their transformation to the frequency-domain. An example of a Newton-Raphson like iterative process for the solution of Harmonic Balancing systems equations is shown in FIG. 4. For the duration of the iterative calculation the multiplication of the Jacobian matrix, that is associated with the circuit equation in the frequency domain, with any vector is performed using finite-differencing. Finite-differencing eliminates the need to store the Jacobian matrix explicitly as shown in FIG. 5. The computation of the solution of the circuit equations may be further improved by preconditioning the Jacobian matrix utilizing an approximation of the inverse of the Jacobian matrix as shown in FIG. 6.

As an illustration of the present invention consider the following circuit equation in the time-domain obtained using Kirchoff's current law $$h(x(t), t) = f(x(t)) + \frac{d}{dt}q(x(t)) + \int_{-\infty}^{t} y(t-\tau)x(\tau)d\tau + b(t) = 0, \quad (1)$$

where f(.) is a vector that represents currents through nonlinear resistive elements, q(.) is a vector that represents charges associated with capacitive elements, y(.) is a matrix summarizing the impulse responses associated with linear subcircuits, x(.) represents a vector of node voltages, and b(.) is a given excitation signal. The calculation of a steady state solution x(.) to the above equation using the Harmonic Balancing technique is performed in the frequency-domain. This technique is explained in H. G. Brachtendorf et al., "A SIMULATION TOOL FOR THE ANALYSIS AND VERIFICATION OF THE STEADY STATE OF CIRCUIT DESIGNS," International Journal of Circuit Theory and Applications, Vol. 23, pp. 311–323, 1995, incorporated by reference herein in its entirety. The above equation may be transformed into the frequency-domain using a Discrete Fourier Transform (DFT) by the application of any algorithm such as a Fast Fourier Transform (FFT) as shown in FIG. 3. The following system of equations represent the operation of the circuit in the frequency-domain $$H(X) = \Gamma f(\Gamma^{-1}X) + j\Omega \Gamma q(\Gamma^{-1}X) + YX + B = 0, \quad (2)$$

where $\Gamma$ is an operator represented by the coefficient matrix of the DFT, and $j=\sqrt{-1}$. Note that sinusoids may also be used as basis functions instead of complex exponentials; see, for example, K. S. Kundert, J. K. White, and A. Sangiovanni-Vinecentelli, "STEADY-STATE METHODS FOR SIMULATING ANALOG AND MICROWAVE CIRCUITS," Kluwer Academic Publishers, incorporated herein in its entirety. Suppose the equation H(X)=0 is to be solved for X, and hence for $x(.)=\Gamma^{-1}X$, using a Newton-Raphson method as shown in FIG. 4.

First, an initial guess, say $X_0$, should be produced by an initializer 410, in order to start the iteration. For example, $X_0$ maybe set to be the result of an AC or DC analysis of the circuit computed using any electronic circuit simulator; e.g. $X_0$ may be computed using SPICE 2G6 from University of California, Berkeley. Alternatively, $X_0$ may be set, for example, to the result of a previous harmonic balancing simulation.

Second, a test must be performed by the convergence tester 430, to determine if a sufficiently accurate solution has been obtained, i.e. to decide whether $|H(X_0)|$ is less than a prespecified tolerance level.

Finally, if a solution has not yet been obtained then another Newton-Raphson iteration must be performed and the value of $X_0$ updated by the solver 440. As iterations of the Newton-Raphson method continue and values of $X_0$ are updated at each iteration so that $|H(X_0)|$ decreases until it reaches a value that is within a predetermined tolerance range. A harmonic balancing solver for an exemplary embodiment is shown in greater detail in FIG. 5. In each iteration harmonic balancing solver 500 of FIG. 5 approximates the solution of the linear system of equations $J\Delta x=-H(X_0)$ for $\Delta x$, where J represents the Jacobian matrix (evaluated at $X_0$) associated with the circuit equation H(X)=0, i.e.

$$J = \frac{\partial H}{\partial X},$$

and $\Delta x$ is a quantity to be used to update the value of $X_0$ at the end of the iteration.

For an electronic circuit simulation system in accordance with the present invention, the matrix-vector product $$\frac{\partial H}{\partial X}a = Ja$$

can be formed using a finite-difference approximation applied to the nonlinear circuit equations. The finite-difference approximation facilitates a memory-efficient Harmonic Balance implementation. The finite-difference approximation requires the evaluation of a function, given in terms of the nonlinear circuit equations, at each iteration of the linear solver 530. In this way it is not necessary to explicitly calculate any derivatives associated with the system matrices. Moreover, the memory requirements, using finite differencing, are proportional to the number of unknowns, i.e. the dimension of $\Delta x$.

The linear solver 530 shown in FIG. 5 solves linear systems of equations by an iterative method such as Krylov subspace methods. Iterative methods for the solution of linear systems of equations including Krylov subspace methods are described in Y. Saad, *Iterative Methods for Sparse Linear Systems,* PWS Publishing Company, Boston, 1996 incorporated herein in its entirety. To solve the linear system $J\Delta x=-H(X_0)$ and perform the Newton-Raphson iteration for the circuit equations the linear solver 530 should have the ability to multiply the Jacobian matrix $$J = \frac{\partial H}{\partial X}$$

by an arbitrary vector. The product of the Jacobian matrix by a vector is calculated by the Jacobian multiplier 540 shown in FIG. 5. The Jacobian multiplier calculates the product of the Jacobian matrix $$J = \frac{\partial H}{\partial X}$$

by a vector, say a, approximating the value Ja by a finite-differencing expression such as $$\frac{H(X + \alpha a) - H(X)}{\alpha}, \quad (3)$$

where the finite-differencing expression (3) is referred to as forward-differencing when a>0 and as backward-differencing when a<0. Alternatively, the Jacobian multiplier may calculate the product of the Jacobian matrix $$J = \frac{\partial H}{\partial X}$$

by a vector, say a, approximating the value Ja by a central finite-differencing expression such as $$\frac{H(X+\alpha a)-H(X-\alpha a)}{2\alpha}, \tag{3a}$$

for $a \neq 0$.

The calculation performed by Jacobian multiplier 540 approximates the value Ja without storing the components of J or explicitly calculating J. An Electronic circuit to be simulated may have a large number of components, devices, and interconnections. In fact, the size and complexity of the circuit may cause the associated Jacobian matrix to have dimensions that are so large that storing the Jacobian matrix becomes a lengthy, costly or indeed impossible task. With the use of a finite-differencing method for calculating Ja of the present invention it is still possible to simulate large circuits in a timely manner and without the need to compute and store the Jacobian matrix associated with the circuit equations. The use of some Krylov subspace methods may require the computation of $J^T a$ in addition to Ja. The additional computation of $J^T a$ may be performed by Jacobian multiplier 540 as well. Either a direct computation of $J^T a$ is performed, or an appropriate approximation method (not disclosed herein) may be applied.

A tester 520 tests whether the solution to the linear system of equations $J\Delta x = -H(X_0)$ is within the required accuracy. The required accuracy of the solution $\Delta x$ is achieved when $$|H(X_0)+J\Delta x| \leq \eta |H(X_0)|, 0 < \eta < 1 \tag{4}$$

where $\eta$ is adjusted according to the Eisenstat-Walker formula. The variable $\eta$ having been chosen to control the desired accuracy of the solution $\Delta x$ to the linear system of equations $J\Delta x = -H(X_0)$. If the desired accuracy has been achieved then the value of $X_0$ is updated to $X_0 + \lambda \Delta x$ by an update rule such as the Armijo rule, i.e. where $0 < \lambda \leq 1$ is a damping parameter satisfying $|H(X_0 + \lambda \Delta x)| < (1-\gamma\lambda)|H(X_0)|$ determined by the updater 510. The updater 510, controlled by a parameter $0 < \gamma < 1$, performs a line search to adjust the parameter $\lambda$ to satisfy the update rule. The updated value $X_0 \leftarrow X_0 + \lambda \Delta x$ is received by the tester 430, shown in FIG. 4, and a determination made whether the solution $X_0$ has been found or whether another Newton-Raphson iteration is to be performed.

The following is an exemplary implementation of a damped, inexact Newton-Raphson method for solving general nonlinear systems of equations $H(X)=0$, starting with an initial guess $X_0$ do while $|H(X_0)|$>tolerance, evaluate function $H(X_0)$ and Jacobian $$J = \frac{\partial H}{\partial X},$$

solve linear system $J\Delta x = -H(X_0)$ to determine the Newton direction, perform line search so that $|H(X_0+\lambda \Delta x)| < (1-\gamma\lambda)|H(X_0)|$, $0 < \lambda \leq 1$, update solution: $X_0 \leftarrow X_0 + \lambda \Delta x$.

An exemplary C++ declaration for an abstract Newton-Raphson solver class is given by:

```
class Newton {
public:
    int iterlim;
    double abstol;
    double gamma;
    Newton ( int dim );
    virtual int resid ( double *rsd ) = 0;
    virtual int resid_jacobian ( double *rsd ) = 0;
    virtual int linsys_factor ( ) = 0;
    virtual int linsys_solve ( double *rhs, double eta ) = 0;
    int Solve ( double *x );
}.
```

The user of this class provides the following functions for the specific problem to be solved:

TABLE 1.1

User-supplied Functions in Newton Class

| C++ method | description |
| --- | --- |
| resid | return function value H (known as the residuals) |
| resid_jacobian | evaluate Jacobian matrix $J=\partial H|\partial X$ and return function value H |
| linsys_factor | factor the Jacobian matrix $J=\partial H|\partial X$ |
| linsys_solve | solve linear system to determine the Newton direction $\Delta X$ |

The user-supplied functions are expected to return a non-zero status code when a computation is unsuccessful; the solver attempts to recover from a failed resid computation. Note that in the Newton class no assumptions are made regarding the structure of the Jacobian matrix. Thus, it is up to the user to provide a suitable linear solver. The Newton class may serve to insulate the user from the control structure in a Newton solver.

Robust convergence and efficiency of Harmonic Balancing techniques are greatly improved by the introduction of a preconditioner that approximates the Jacobian matrix associated with the circuit equations in the frequency domain. A simple DC preconditioner may be used in the simulation of electronic circuits. This preconditioner corresponds to the large Jacobian matrix when the circuit is linearized about the average of its steady-state value. The preconditioner consists of a sequence of uncoupled diagonal blocks. Each block has the same non-zero pattern, and is parameterized by a Fourier frequency.

An efficient Harmonic Balance implementation seeks to exploit a situation, that may occur in practice, in which many of the diagonal blocks are identical. Blocks are identical in the sense that the magnitude of the respective Fourier frequencies they are parameterized by are equal, or substantially equal. Matrix factorizations of diagonal blocks corresponding to frequencies that are numerically very close may be shared. Suppose two blocks are considered identical if the difference between the absolute values of their respective Fourier frequencies is smaller than some tolerance. Then the number of distinct blocks may be a small fraction of the total number of blocks. Therefore, a dramatic reduction in computation time or memory requirements may result from the application of a preconditioner in electronic circuit simulators. In the presence of off-diagonal-block terms in the preconditioning matrix, the same improvement to the computation described above can still be applied to the main diagonal blocks. Two factors are significant in determining whether various diagonal blocks are identical: the difference between the Fourier frequencies involved in the analysis of the circuit, and the desired level of accuracy of solutions in the linear solver 530.

A harmonic balancing solver 600 in accordance with another exemplary embodiment of the present invention is shown in detail in FIG. 6. The function and operation of solver 600 is similar to that of solver 500 shown in FIG. 5 except that the Jacobian matrix associated with the circuit equation is preconditioned by a matrix computed by a preconditioning matrix generator 650. The Jacobian multiplier 640 calculates the product of the preconditioned Jacobian matrix by a vector.

Preconditioning may improve the speed and accuracy of the solver and hence of the whole circuit simulator. Preconditioning refers to, for example, the pre-multiplication (left-preconditioning) by a matrix, say $M^{-1}$, of the linear equation to be solved. In the case of the system of equations (2) the linear equation to be solved is the equation $J\Delta x=-H(X_0)$; the equation governing the Newton-Raphson iteration. Thus, left preconditioning of $J\Delta x=-H(X_0)$ amounts to forming $M^{-1}J\Delta x=-M^{-1}H(X_0)$.

The speed and accuracy of the solver is improved when the matrix $M^{-1}J$ is an approximation for the identity matrix. i.e. the preconditioning matrix M is a good approximation of the Jacobian. In the case of left preconditioning the linear solver 630 solves the equation $M^{-1}J\Delta x=-M^{-1}H(X_0)$ for $\Delta x$. The product of the product of the Jacobian matrix J by the left-premultiplier $M^{-1}$ by a vector is calculated by the Jacobian multiplier 640 shown in FIG. 6. The Jacobian multiplier calculates the product of the product of the Jacobian matrix $$J = \frac{\partial H}{\partial X}$$

by the left-premultiplier $M^{-1}$ by a vector, say a, approximating the value $M^{-1}Ja$ by a finite-differencing expression such as $$\frac{M^{-1}H(X+\alpha a) - M^{-1}H(X)}{\alpha}, \quad (5)$$

without storing the components of J or explicitly calculating J. It may also be possible to approximate the value $M^{-1}Ja$ by a central differencing expression.

It is also possible to right-precondition the linear equation $J\Delta x=-H(X_0)$ with the matrix $M^{-1}$ to form the equivalent linear equation $JM^{-1}M\Delta x=-H(X_0)$. In this case the linear solver 630 solves the equation $JM^{-1}M\Delta x=-H(X_0)$ for $M\Delta x$. The product of the product of the Jacobian matrix J by the right-premultiplier $M^{-1}$ by a vector is calculated by the Jacobian multiplier 640 shown in FIG. 6. The Jacobian multiplier calculates the product of the product of the Jacobian matrix $$J = \frac{\partial H}{\partial X}$$

by the right-premultiplier $M^{-1}$ by a vector, say a, approximating the value $JM^{-1}a$ by a finite-differencing expression such as $$\frac{H(X+\alpha M^{-1}a) - H(X)}{\alpha}, \quad (6)$$

without storing the components of J or explicitly calculating J. It may also be possible to approximate the value $JM^{-1}a$ by a central differencing expression. Note that it is also possible to apply the methodology presented in the foregoing to the case of split preconditioning. That is, to a linear equation of the form $$M_1^{-1}JM_2^{-1}M_2\Delta x=-M_1^{-1}H(X_0).$$

For the use of some Krylov subspace methods it may be desirable for Jacobian multiplier 640 to calculate the product (s) $M^{-1}Ja$, $J^T M^{-T}a$, and/or $JM^{-1}a$, $M^{-T}J^T a$.

The Jacobian matrix associated with the circuit equations, in this example, is structured as a combination of diagonal blocks and off-diagonal terms. The diagonal blocks are all square blocks having the same dimension. Each diagonal block is associated with a frequency. The frequencies associated with each square diagonal block of the Jacobian matrix are the mixing frequencies of the input excitation signal.

The preconditioning matrix generator 650 first forms the matrix $\overline{M}$ by ignoring or setting to zero all off-diagonal terms that do not belong to the diagonal blocks of the Jacobian matrix. Thus, the matrix $\overline{M}$ has, for example, the structure $$\overline{M} = \begin{bmatrix} \overline{G}+j\omega_1\overline{C}+Y_{\omega_1} & 0 & 0 \\ 0 & \ddots & 0 \\ 0 & 0 & \overline{G}+j\omega_n\overline{C}+Y_{\omega_n} \end{bmatrix}, \quad (7)$$

where $\omega_1, \ldots, \omega_n$ are frequencies that represent harmonics and intermodulations of frequencies of the input excitation signal, associated respectively with the diagonal blocks, $\overline{G}$ represents average conductance $$\frac{\partial f}{\partial x}$$

of the circuit, $\overline{C}$ represents the average capacitance $$\frac{\partial q}{\partial x}$$

of the circuit, and $Y_{\omega_1}, \ldots, Y_{\omega_n}$ are terms associated with the linear subcircuits. The preconditioning matrix generator 650 then computes the inverse $M^{-1}$ as follows: first, the diagonal blocks $\overline{G}+j\omega_i\overline{C}+Y_{\omega_i}$, i=1, ..., n are sorted according to the values of $|\omega_1|, \ldots, |\omega_n|$, then the blocks are partitioned into sets of blocks having similar frequencies associated with them, for example, frequencies that differ in magnitude by less than a given tolerance level, and third, an inverse for each set of blocks is computed once. The inverses computed for the sets of blocks may thus be computed in parallel. In other words, the $k^{th}$ block and the $1^{th}$ block belong to the same set if $|\omega_k - \omega_1| < \epsilon$ and $\text{sgn}(\omega_k) = \text{sgn}(\omega_1)$, were $\epsilon$ is a given tolerance level.

For each set of blocks a representative frequency is chosen. If there are m sets of diagonal blocks then m frequencies are associated with the sets, say $\hat{\omega}_1, \ldots, \hat{\omega}_m$, respectively. In addition, if the frequency $\hat{\omega}_i$ is chosen as representative for a set of blocks associated with positive frequencies then the representative frequency $-\hat{\omega}_i$ may be chosen for the set of blocks associated with the negative counterparts. The representative frequency $\hat{\omega}_i$ for the $i^{th}$ set may be chosen, for example, as one of the frequencies associated with the blocks in the $i^{th}$ set or the average absolute value of the frequencies associated with the blocks in the $i^{th}$ set or the like. The matrix $M^{-1}$ is formed as a block diagonal matrix having n blocks, but only m of those blocks are distinct. More precisely, the matrix $M^{-1}$ has the form $$M^{-1} = \begin{bmatrix} M_1^{-1} & 0 & 0 \\ 0 & \ddots & 0 \\ 0 & 0 & M_n^{-1} \end{bmatrix} \quad (8)$$

where $M_i \in \{\overline{G}+j\hat{\omega}_1\overline{C}+Y_{\hat{\omega}_1}: l \in \{1, \ldots, m\}\}$, $i \in \{1, \ldots, n\}$. Note that when the representative frequency $\hat{\omega}_j = -\hat{\omega}_i$ is chosen for the set of blocks associated with negative counterparts of the frequencies represented by $\hat{\omega}_i$, $$M_j = \overline{G} + j\hat{\omega}_j\overline{C} + Y_{\hat{\omega}_j} = \overline{G} - j\hat{\omega}_i\overline{C} + Y_{\hat{\omega}_1}.$$

Once $M_i^{-1} = [\overline{G}+j\hat{\omega}_i\overline{C}+Y_{\hat{\omega}_i}]^{-1}$ is computed, $M_j^{-1}$ is immediately given by $[M_i^{-1}]^*$ the complex conjugate of $M_i^{-1}$. In other words, when $\hat{\omega}_j = -\hat{\omega}_i$, only one inverse matrix, $M_i^{-1}$ may be computed.

The computation of $M^{-1}$ described above may greatly reduce the number of calculations involved in the inversion of $\overline{M}$, i.e. in the calculation of the preconditioner. Many of the diagonal blocks of the matrix $\overline{M}$ may be associated with similar frequencies. Thus, the number of blocks n may be much larger than the number of sets of blocks with similar frequencies m. The matrix $M^{-1}$, however, is computed by performing only m inversions not n. But for the purposes of simulating an electronic circuit the preconditioner M, that is an approximation of the Jacobian matrix, may be as good an approximation of the Jacobian matrix as $\overline{M}$.

An exemplary C++ class, IterSolver, provides a common user interface to iterative methods for solving a general linear system Ax=b. In practice, the linear system is preconditioned, as discussed above, in order to improve reliability and convergence. In left preconditioning the equation $M^{-1} Ax = M^{-1} b$ is solved, and in right preconditioning the equation $(AM^{-1})(Mx) = b$ is solved. The matrix M is chosen such that $M^{-1}A$ or $AA^{-1}$ is an approximation of the identity matrix and M is easier to invert than the original matrix A. A feature of iterative methods is that only matrix-vector products with A and $M^{-1}$ are typically needed for the computation of the solution x. An accurate solution, however, may require many iterations or else the method may not converge if the matrix M is a poor approximation of the original matrix. The performance of iterative methods may depend on the efficiency with which matrix-vector products such as Ay and $M^{-1}y$ are calculated, for some arbitrary vector y arising during the course of computation by an iterative method. For certain methods, the matrix-vector products $A^T y$ and $M^{-T} y$ may also be needed.

An exemplary C++ declaration for the abstract IterSolver class is given by:

```
class IterSolver {
public:
    double stop_tol;
    int     rightPreCond;   // left or right preconditioning
    IterSolver ( int dim, int iterlim );
    virtual void pre_slv ( double* rhs ) = 0;
    virtual void pre_slvT ( double* rhs ) = 0;
    virtual void apply ( double* in, double* out ) = 0;
    virtual void applyT ( double* in, double* out ) = 0;
    virtual void solve ( double* rhs ) = 0;
};
```

Such an iterative solver terminates the computation process when $|Ax-b|/|b|$ falls below stop_tol or the number of iterations exceeds iterlim. In order to implement iterative solvers a constructor should be built and the solve method specified. GMRES, QMR, and BiCGSTAB iterative solvers may be created in accordance with the above description. The user of such an iterative solver provides the following functions for the specific linear system to be solved:

TABLE 2.1

| User-supplied Functions in IterSolver Class | |
|---|---|
| C++ method | description |
| pre_slv | multiply $M^{-1}$ by a vector |
| pre_slvT | multiply $M^{-T}$ by a vector |
| apply | multiply A by a vector |
| applyT | multiply $A^T$ by a vector |

Creating a Newton-Raphson iterative algorithm may be accomplished by combining the functionality of the Newton class and the IterSolver class. In the linsys-solve method of the Newton class, the Newton direction $\Delta x$ is determined by solving the linear Jacobian system $J\Delta x = -H(X_0)$. Once this linear system is solved using an iterative method, the overall algorithm is referred to as the Newton-Iterative algorithm. The desired accuracy in the Newton direction is set by the 'eta' parameter in the Newton class, and the corresponding stop_jol parameter in the IterSolver class. In the context of the inexact Newton algorithm, right preconditioning is generally preferable, because the accuracy in the Newton direction as determined by (4) can be controlled directly.

What is claimed:

1. In a method for simulating the response of a circuit to an excitation signal using a digital computer, the circuit described by a plurality of nodes each connected to at least one device, the circuit behavior at each of the plurality of nodes described by a set of circuit equations, the improvement comprising the steps of:

a) determining a first plurality of frequencies related to harmonics of the excitation signal;

b) sorting the first plurality of frequencies into a second plurality of frequencies, so that when at least two frequencies are substantially the same, the at least two frequencies are grouped as one frequency within the second plurality of frequencies;

c) forming a plurality of diagonal blocks of a Jacobian matrix, associated with the set of circuit equations, each diagonal block corresponding to a frequency from the second plurality of frequencies;

d) generating a set of inverse matrices each inverse matrix associated with a diagonal block within the plurality of diagonal blocks; and e) creating a preconditioning matrix for the Jacobian matrix from the set of inverse matrices to be used in simulating the circuit.

2. The method of claim 1 wherein the at least two frequencies are grouped into one frequency when the respective frequencies of the at least two frequencies have values that are within a tolerance value of each other.

* * * * *